United States Patent [19]
Kikuchi et al.

[11] 3,942,039
[45] Mar. 2, 1976

[54] DISTORTIONLESS FET SWITCHING CIRCUIT

[75] Inventors: Masafumi Kikuchi, Atsugi; Masashi Takeda, Isehara, both of Japan

[73] Assignee: Sony Corporation, Tokyo, Japan

[22] Filed: May 20, 1974

[21] Appl. No.: 471,595

[30] Foreign Application Priority Data
May 24, 1973  Japan................................ 48-58391

[52] U.S. Cl................................. 307/251; 307/237
[51] Int. Cl.$^2$.................H03K 17/60; H03K 17/66; H03K 17/10; H03K 5/00
[58] Field of Search.................... 307/237, 251, 304; 328/165, 171, 169, 150, 151; 330/145, 164

[56] References Cited
UNITED STATES PATENTS

| | | | |
|---|---|---|---|
| 3,448,293 | 6/1969 | Russell................................ | 307/251 |
| 3,521,141 | 7/1970 | Walton........................ | 307/251 X |
| 3,532,899 | 10/1970 | Huth et al........................... | 307/251 |
| 3,558,921 | 1/1971 | Yokozawa et al................. | 307/251 |
| 3,678,297 | 7/1972 | Takahashi........................... | 307/251 |
| 3,708,694 | 1/1973 | Evans............................ | 307/251 X |
| 3,746,893 | 7/1973 | Bretagne........................... | 307/304 |
| 3,764,921 | 10/1973 | Huard.............................. | 307/251 X |

FOREIGN PATENTS OR APPLICATIONS
1,762,420  4/1970  Germany............................ 307/251

OTHER PUBLICATIONS
Field Effect Transistors – Theory and Applications Notes, No. 2 Amelco Semiconductor Division of Teledyne, Inc., pp. 1-7; 6/1962.

*Primary Examiner*—Stanley D. Miller, Jr.
*Assistant Examiner*—L. N. Anagnos
*Attorney, Agent, or Firm*—Hill, Gross, Simpson, Van Santen, Steadman, Chiara & Simpson

[57] ABSTRACT

A switching circuit is disclosed in which a first field effect transistor (which will be hereinafter referred to as an FET simply) is provided in such a manner that its source-drain are connected between an input terminal and output terminal and its source and drain electrodes are connected to a bias source through resistors, and a second FET of a source follower type is provided such that its gate electrode is connected to the source electrode of the first FET and its source electrode is connected to the gate electrode of the first FET. In this case, by changing the source electrode voltage level of the second FET, the first FET is made on and off to perform a switching operation.

6 Claims, 2 Drawing Figures

DISTORTIONLESS FET SWITCHING CIRCUIT

BACKGROUND OF THE INVENTION

1. Field of the Invention

The present invention relates generally to a switching circuit, and more particularly is directed to a switching circuit with a wide dynamic range using a junction type FET.

2. Description of the Prior Art

A switching circuit is proposed in the prior art as shown in FIG. 1. In the prior art switching circuit shown in FIG. 1, if FETs 1 and 2 are of a P-channel junction type, the FETs 1 and 2 are made conductive (on) when their gate electrodes are in the ground voltage, while they are made nonconductive (off) when their gate electrodes are in a plus voltage to achieve the switching operation.

With the prior art switching circuit shown in FIG. 1, in the case where the FETs 1 and 2 are made conductive, when an input voltage exceeds 0.7V (volts), the FETs 1 and 2 are biased forwardly between their gate-source by the input voltage to flow the gate current, so that at this time the part of the input voltage higher than 0.7V is clipped. That is, with the prior art switching circuit shown in FIG. 1, there is a defect that a clip may occur for a large input to narrow a so-called dynamic range.

Further, the impedance of the FETs 1 and 2 between their source-drain is fluctuated or changed by the level of an input signal, so that there may be produced much distortions.

SUMMARY OF THE INVENTION

According to the present invention, there is provided a switching circuit in which the source-drain of a first FET are connected between an input terminal and an output terminal, the source and drain electrodes of the first FET are connected to a bias source through resistors, a second FET of a source follower type is provided, the gate electrode of the second FET is connected to the source electrode of the first FET, and the source electrode of the second FET is connected to the gate electrode of the first FET. In this case, by changing the source electrode voltage level of the second FET, the first FET is made on and off to achieve a switching operation.

OBJECTS OF THE INVENTION

It is an object of the present invention to provide a switching circuit free from the drawbacks encountered in the prior art switching circuit mentioned above.

It is another object of the invention to provide a switching circuit with a wide dynamic range.

It is a further object of the invention to provide a switching circuit for avoiding the distortion which may be caused by the variation of an input signal in level.

It is a yet further object of the invention to provide a switching circuit of an FET which can be easily formed as an integrated circuit.

The additional and other objects, features and advantages of the invention may be apparent from the following description taken in conjunction with the accompanying drawing.

DESCRIPTION OF THE PREFERRED EMBODIMENT

Figure 2:
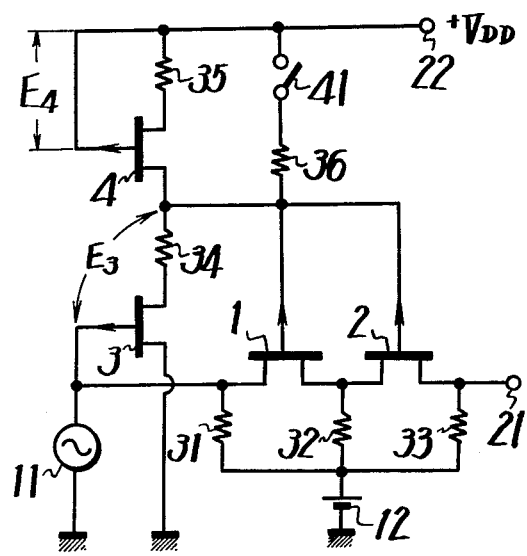
FIG. 2 is a connection diagram of an embodiment of the switching circuit according to the present invention.

A description will be hereinafter given on an embodiment of the switching circuit according to this invention with reference to FIG. 2. In FIG. 2, reference numerals 1–4 indicate FETs of a P-channel junction type. Between an input signal source terminal 11 and an output terminal 21, the source-drain of the FETs 1 and 2 are connected in series to provide a continuous DC coupling. The source electrode of the FET 1, the drain electrode of the FET 1 and the source electrode of the FET 2, and the drain electrode of the FET 2 are connected to a common bias source 12 through resistors 31, 32 and 33 with the same resistance value, respectively.

The gate electrode of the FET 3 is connected to the signal source 11, and also to the source electrode of the FET 1, its drain electrode is grounded, and its source electrode is connected through a resistor 34 to the drain electrode of the FET 4. The source electrode of the FET 4 is connected through a resistor 35 to a voltage source terminal 22 of $+V_{dd}$ and its gate electrode is connected also to the terminal 22. Thus, the FET 4 is made as a constant current source and the FET 3 is made as a source follower type with the FET 4 as a load. In this case, the FETs 3 and 4 are made equal in characteristics and the resistors 34 and 35 are made to have the same resistance value. The bias source 12 also serves as a gate bias source for the FET 3. The drain electrode of the FET 4 is connected to the gate electrodes of the FETs 1 and 2, respectively, and connected to the terminal 22 through a resistor 36 and a switch 41.

With such a circuit construction of the invention described as above, since the drain current of the FET 3 and the drain current of the FET 4 are equal with each other in the case of the switch 41 being made off, the FETs 3 and 4 are same in characteristics and the resistors 34 and 35 are equal in resistance value, voltages $E_3$ and $E_4$ (refer to FIG. 2) become as $E_3 = E_4 = 0$ at this time. Further, since the voltage $E_3$ is also the voltage across the gate-source of the FETs 1 and 2, in this case the voltage across the gate-source of the FETs 1 and 2 is 0. As a result, the FETs 1 and 2 become on to deliver the signal from the signal source 11 to the output terminal 21 through the FETs 1 and 2.

On the other hand, when the switch 41 is made on, the condition $E_3 \neq 0$ is established by the voltage $+V_{dd}$ at the terminal 22 and hence the FETs 1 and 2 are made off. As a result, no output signal is delivered to the output terminal 21.

Figure 1:
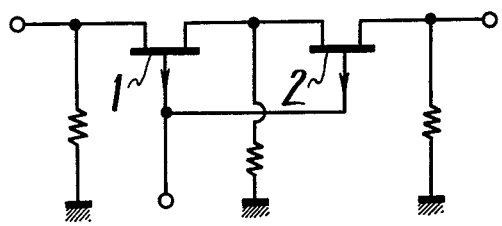
FIG. 1 is a connection diagram of a prior art switching circuit.

As described above, the switching operation is carried out by making the switch 41 on and off. In this case, however, the bias voltage from the bias source 12 is chosen higher than the level of the input signal applied to the FETs 1 and 2, so that the signal clipping encountered in the prior art shown in FIG. 1 does not occur until the level of the input signal approaches the magnitude of the bias voltage. Thus, it may be understood that the dynamic range of the switching circuit of the invention is wide.

Further, in the case where the switch 41 is in off-state and the FETs 1 and 2 are in on-state, the voltage $E_3$ across the gate-source of the FETs 1 and 2 is zero ($E_3 = 0$) irrespective of the level of the input signal, so that the impedance between the sourcedrain of the FETs 1 and 2 is not changed by the level of the input signal with the result that any distortion is not caused by the variation of the input signal in level. That is, the FET 3 operates as the type of source follower with the FET 4 as a load and, due to the fact that the source and gate electrodes of the FETs 1 and 2 are supplied with the signals same in phase and level from the signal source 11, the impedance between the source-drain of the FETs 1 and 2 is not changed in accordance with the level of the input signal. As a result, any distortion, which may be caused by the variation or fluctuation of the input signal in level, is prevented from being generated.

Further, since the resistors 31–33 are selected equal in resistance value, no current flows through the source-drain of the respective FETs 1 and 2 when the switch 41 is in on-state. Accordingly, even if the switch 41 is made on and off, the DC voltage at the output terminal 21 is not changed, or no pulsating noise is produced upon switching.

In addition, the circuit of the invention can be easily made as an integrated circuit due to the circuit construction mentioned as above.

Instead of employing the switch 41 and the resistor 36 in the illustrated embodiment, it may be possible that the gate electrode voltage level of the FET 4 is changed to vary the drain electrode voltage level thereof and hence to make the FETs 1 and 2 on and off.

Further, the number of the FETs corresponding to the FETs may be changed with the same result.

The above description is given on the preferred embodiment of the invention, but it may be apparent that many modifications and variations could be effected by those skilled in the art without departing from the spirits and scope of the novel concepts of the invention.

We claim as our invention:

1. A switching circuit adapted for switching of an input signal having a large dynamic range without clipping and distortion, comprising:
   a. FET means having a source-drain current path DC coupled between signal input and output terminals and also having a gate connection;
   b. a bias source means connected to said source drain path for determining a DC voltage level at said input and output terminals;
   c. a source follower FET means connected between said signal input terminal and the gate connection of said FET means;
   d. a voltage source;
   e. a switching means directly connected, without any intervening elements, between said voltage source and said FET means gate connection; and
   f. loading means connected between said voltage source and the source of said source follower FET means.

2. A switching circuit according to claim 1 in which said FET means comprises a series connection of two FET's in which the FET means gate connection comprises a common connection of a gate from each of the two FETs.

3. A switching circuit according to claim 1 in which said bias source means comprises a bias voltage source connected to said source-drain current path by a plurality of resistors.

4. A switching circuit according to claim 1 in which said source follower FET means comprises an FET having a grounded drain and a resistor connected to a source electrode of the FET.

5. A switching circuit according to claim 1 in which said loading means comprises an FET constant current source.

6. An FET switching circuit comprising:
   a. input and output terminals;
   b. a first FET having a source directly connected to said input;
   c. a second FET having a source directly connected to the first FET drawn and a drawn directly connected to the output terminal;
   d. a bias source;
   e. first, second, and third resistors connecting the bias source to each of the drain and source terminals of said first and second FETs;
   f. a source follower FET having a gate connected to the input terminal, a grounded drain, and a source connected to both gates of the first and second FETs through a fourth resistor;
   g. a voltage source;
   h. a constant current FET having a source connected to said voltage source through a fifth resistor, a gate connected to said voltage source, and a drain connected to the gates of said first and second FETS; and
   i. a switch having one end connected to said voltage source and the other end connected through a sixth resistor to said first and second FET gates.

* * * * *